United States Patent
Wang et al.

(10) Patent No.: US 12,063,866 B2
(45) Date of Patent: Aug. 13, 2024

(54) MULTILAYER MAGNETIC TUNNEL JUNCTION ETCHING METHOD AND MRAM DEVICE

(71) Applicant: JIANGSU LEUVEN INSTRUMENTS CO. LTD, Jiangsu (CN)

(72) Inventors: Juebin Wang, Jiangsu (CN); Zhongyuan Jiang, Jiangsu (CN); Ziming Liu, Jiangsu (CN); Dongchen Che, Jiangsu (CN); Hushan Cui, Jiangsu (CN); Dongdong Hu, Jiangsu (CN); Lu Chen, Jiangsu (CN); Dajian Han, Jiangsu (CN); Zhiwen Zou, Jiangsu (CN); Kaidong Xu, Jiangsu (CN)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 673 days.

(21) Appl. No.: 17/289,753

(22) PCT Filed: May 23, 2019

(86) PCT No.: PCT/CN2019/088104
§ 371 (c)(1),
(2) Date: Apr. 29, 2021

(87) PCT Pub. No.: WO2020/093682
PCT Pub. Date: May 14, 2020

(65) Prior Publication Data
US 2021/0376232 A1    Dec. 2, 2021

(30) Foreign Application Priority Data
Nov. 8, 2018 (CN) .......................... 201811325940.2

(51) Int. Cl.
*H10N 50/01* (2023.01)
*G11C 11/16* (2006.01)
(Continued)

(52) U.S. Cl.
CPC .......... *H10N 50/01* (2023.02); *G11C 11/161* (2013.01); *H01L 21/3065* (2013.01);
(Continued)

(58) Field of Classification Search
CPC ..................................................... H01N 50/01
See application file for complete search history.

(56) References Cited

U.S. PATENT DOCUMENTS 9,362,490 B1 *  6/2016  Xiao ..................... H10N 50/01
2015/0255507 A1  9/2015  Pakala et al.
(Continued)

FOREIGN PATENT DOCUMENTS

CN    103985672    8/2014
CN    106067513    11/2016
(Continued)

OTHER PUBLICATIONS

Machine Translation for CN10667653 (Year: 2017).*
(Continued)

*Primary Examiner* — Michael Carter
*Assistant Examiner* — Stephen Sutton Kotter
(74) *Attorney, Agent, or Firm* — JCIP GLOBAL INC.

(57) ABSTRACT

A multilayer magnetic tunnel junction etching method and an MRAM device. A wafer is processed according to particular steps without interrupting vacuum. A reactive ion plasma etching chamber (10) and an ion beam etching chamber (11) are used separately at least one time. The processing of a multilayer magnetic tunnel junction is always in a vacuum environment, thereby avoiding the impact of an external environment on etching. By means of (Continued)

the process of combining etching and cleaning, a device structure maintains good steepness, and the metal contamination and damage of a magnetic tunnel junction film structure are significantly decreased, thereby greatly increasing the performance and reliability of a device. In addition, use of both the ion beam etching chamber (11) and the reactive ion plasma etching chamber (10) solves the technical problem of an existing single etching method, and increases production efficiency and etching process precision.

10 Claims, 10 Drawing Sheets

(51) Int. Cl.
    *H01L 21/3065*     (2006.01)
    *H10B 61/00*     (2023.01)
    *H10N 50/10*     (2023.01)
    *H10N 50/80*     (2023.01)
    *H10N 50/85*     (2023.01)

(52) U.S. Cl.
    CPC .............. *H10B 61/00* (2023.02); *H10N 50/10* (2023.02); *H10N 50/80* (2023.02); *H10N 50/85* (2023.02)

(56) References Cited

U.S. PATENT DOCUMENTS

| | | | | |
|---|---|---|---|---|
| 2016/0027999 A1* | 1/2016 | Pinarbasi | ............... | H10N 50/80 438/3 |
| 2019/0214553 A1* | 7/2019 | Gajek | ................... | H10B 61/22 |

FOREIGN PATENT DOCUMENTS

| | | | | |
|---|---|---|---|---|
| CN | 106676532 | | 5/2017 | |
| CN | 106676532 A | * | 5/2017 | ................ C23F 4/00 |
| CN | 107610994 | | 1/2018 | |
| CN | 107623014 | | 1/2018 | |
| CN | 107623014 A | * | 1/2018 | |
| CN | 109065480 | | 12/2018 | |
| JP | 2014067837 | | 4/2014 | |
| KR | 20170039127 | | 4/2017 | |

OTHER PUBLICATIONS

Machine Translation for Chen (Year: 2018).*
"International Search Report (Form PCT/ISA/210) of PCT/CN2019/088104", mailed on Aug. 21, 2019, with English translation thereof, pp. 1-5.

* cited by examiner

MULTILAYER MAGNETIC TUNNEL JUNCTION ETCHING METHOD AND MRAM DEVICE

CROSS-REFERENCE TO RELATED APPLICATION

This application is a 371 of international application of PCT application serial no. PCT/CN2019/088104, filed on May 23, 2019, which claims the priority benefit of China application no. 201811325940.2, filed on Nov. 8, 2018. The entirety of each of the above mentioned patent applications is hereby incorporated by reference herein and made a part of this specification.

BACKGROUND

Technical Field

The present invention relates to the field of semiconductor technologies, and in particular, to a multilayer magnetic tunnel junction (MTJ) etching method and a magnetic random access memory (MRAM) device.

A magnetic memory is an important part of the computer architecture and has a decisive impact on the speed, integration, and power consumption of the computer. However, it is difficult for the existing memory to achieve various performance indicators. For example, a hard disk has a high storage capacity (which may reach up to 1.3 Tb/in$^2$) but a rather slow access speed (in microseconds). On the contrary, a cache has a high speed but low integration. In order to take full advantages of various memories, a typical computer storage system uses a hierarchical structure. On one hand, frequently used instructions and data are stored in the cache and the main memory, so as to rapidly interact with a central processing unit. On the other hand, a large number of infrequently used system programs and files are stored in a high-density hard disk (an HDD or SSD). By using such a hierarchical structure, the storage system combines the advantages of a high speed and high capacity. However, as the feature size of a semiconductor process is further reduced, the conventional cache and main memory based on a complementary metal oxide semiconductor (CMOS) process hit a performance bottleneck. In terms of power consumption, since the leakage current of a CMOS transistor increases with the reduction of the process size, the static power consumption of the SRAM and DRAM increasingly grows. As for the speed, the interconnect delay between the processor and the memory limits the main frequency of the system. An effective way to solve this problem is to construct a non-volatile cache and main memory, so that the system can work in a sleep mode but won't lose data, thus eliminating the leakage current and static power consumption. Moreover, the non-volatile memory can be directly integrated on a CMOS circuit by means of a back-of-end-line technique, reducing the interconnect delay. The STT-MRAM can achieve a good compromise in terms of speed, area, write times, and power consumption, and thus is considered as an ideal device for building a next-generation non-volatile cache and main memory in the industry.

A core part of an MTJ is a sandwich structure formed by sandwiching a tunneling barrier layer between two ferromagnetic metal layers. One of the ferromagnetic layers is referred as a reference layer or a pinned layer and its magnetization is fixed along an easy-axis direction. The other ferromagnetic layer is referred as a free layer, and its magnetization has two stable directions which are parallel or antiparallel to the pinned layer. Thus, the MTJ is rendered in a low resistance state or high resistance state. This phenomenon is referred to as tunnel magnetoresistance (TMR), and these two resistance states may be represented respectively by using "0" and "1" in binary data.

An etching method is still required as the principal method for MTJ patterning. It is relatively difficult for the material of the MTJ to produce volatile products as compared with a dry etching material such as Fe, Co, or Mg; and further an etchant gas (for example, $Cl_2$) cannot be used, or otherwise the performance of the MTJ is degraded. Therefore, MTJ patterning can be realized by necessarily using a relatively complicated etching method, and an etching process is very difficult and challenging. The conventional etching of large-size MTJs is generally realized by means of ion beam etching (IBE). Because the IBE process uses inert gas, basically no chemical etching component is introduced into a reaction chamber, so that an MTJ sidewall is protected from chemical erosion. Under the condition of ensuring a clean sidewall, a perfect MTJ sidewall which is clean and not chemically damaged can be obtained by means of IBE. However, IBE also has shortcomings. On one hand, one implementation principle of the IBE is the use of a high physical bombardment force, but an excessively large physical bombardment force may cause disturbance in the ordering of atomic layers of the MTJ sidewall, especially in the isolation layer and the nearby core layer, thus disrupting the magnetic characteristics of the MTJ. On the other hand, IBE is realized necessarily by using a certain angle, which brings limitations to the IBE. As MTJ devices are made increasingly smaller in size, the MTJ films and the mask cannot be endlessly compressed in thickness. The MTJ devices with a thickness of 30 nm or less generally have a height-to-width ratio of above 2:1, and a smaller size of the MTJ results in a higher height-to-width ratio. At this height-to-width ratio, IBE cannot be performed to the bottom of the MTJ at a frequently used angle, thus failing to meet the requirement for separation of the MTJ devices, and making the patterning fail. In addition, an IBE time is relatively long, causing a limited yield of each apparatus.

SUMMARY

To solve the foregoing problem, the present invention discloses a multilayer MTJ etching method, which uses an etching device including a sample loading chamber, a vacuum transition chamber, a reactive ion plasma etching chamber, an IBE chamber, a film coating chamber, and a vacuum transport chamber, where the vacuum transition chamber is connected to the sample loading chamber and the vacuum transport chamber separately in a linkable manner; the reactive ion plasma etching chamber, the IBE chamber, and the film coating chamber are separately connected to the vacuum transport chamber in a linkable manner; a sample is processed without interrupting the vacuum, and the reactive ion plasma etching chamber and the IBE chamber are separately used at least one time. The method includes following steps: a sample preparation step and a sample loading step: loading the sample to the sample loading chamber, and the sample entering the vacuum transport chamber through the vacuum transition chamber, where the sample is formed on a semiconductor substrate and includes a bottom electrode, an MTJ, a cap layer, and a mask layer; the MTJ includes a pinned layer, an isolation layer, and a free layer; and there are multiple isolation layers and free layers; a first etching step: the sample entering the reactive ion plasma etching chamber or the IBE chamber, completing etching for the cap layer and the free layer and stopping etching at a first isolation layer, and then the sample returning to the vacuum transport chamber; a first cleaning step: the sample entering the IBE chamber or the reactive ion plasma etching chamber, and removing metallic residues and treating a sample surface, so that metal contamination and a sidewall damage layer formed in the first etching step are completely removed; and then the sample returning to the vacuum transport chamber; a first dielectric coating step: the sample entering the film coating chamber, and forming a first dielectric thin film on the upper surface of and around the sample; and then the sample returning to the vacuum transport chamber; a first dielectric thin film opening step: the sample entering the reactive ion plasma etching chamber or the IBE chamber, opening the first dielectric thin film on the top and bottom portions of the device but leaving the part on a device sidewall, and stopping etching; and then the sample returning to the vacuum transport chamber; repeating the foregoing steps, where each etching is stopped at the next isolation layer till a bottommost isolation layer; a final etching step: the sample entering the reactive ion plasma etching chamber or the IBE chamber, etching the sample, and stopping etching at a bottom electrode metal layer; and then the sample returning to the vacuum transport chamber; a final cleaning step: the sample entering the IBE chamber or the reactive ion plasma etching chamber, and removing metallic residues and treating a sample surface, so that the metal contamination and sidewall damage layer formed in the final etching step are completely removed; and then the sample returning to the vacuum transport chamber; a final dielectric coating step: the sample entering the film coating chamber for coating protection, and forming a final dielectric thin film on the upper surface of and around the sample; and then, the sample returning to the vacuum transport chamber; and a sample take-out step: the sample returning from the vacuum transport chamber to the sample loading chamber through the vacuum transition chamber.

In the multilayer MTJ etching method of the present invention, preferably, gas used in the etching or cleaning step in the reactive ion plasma etching chamber is inert gas, nitrogen, oxygen, fluorine-based gas, $NH_3$, amino gas, CO, $CO_2$, alcohol, or a combination thereof; and the gas, power, airflows, and pressure that are used in different steps are identical or different.

In the multilayer MTJ etching method of the present invention, preferably, gas used in the etching or cleaning step in the IBE chamber is inert gas, nitrogen, oxygen, or a combination thereof; and the gas, ion beam angles, ion beam energy, and ion beam density that are used in different steps are identical or different.

In the multilayer MTJ etching method of the present invention, preferably, materials of the first dielectric thin film and the final dielectric thin film are identical or different; the material of the first dielectric thin film or the final dielectric thin film is a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or a combination thereof; and the materials of the first dielectric thin film are identical or different in different first dielectric coating steps.

An MRAM device is provided, which includes a multilayer MTJ prepared by using the multilayer MTJ etching method according to claim 1, where each isolation layer and a free layer above the isolation layer in the multilayer MTJ present a step-like structure.

A multilayer MTJ etching method is further provided, which uses an etching device including a sample loading chamber, a vacuum transition chamber, a reactive ion plasma etching chamber, an IBE chamber, a film coating chamber, and a vacuum transport chamber, where the vacuum transition chamber is connected to the sample loading chamber and the vacuum transport chamber separately in a linkable manner; the reactive ion plasma etching chamber, the IBE chamber, and the film coating chamber are separately connected to the vacuum transport chamber in a linkable manner; a sample is processed without interrupting the vacuum, and the reactive ion plasma etching chamber and the IBE chamber are separately used at least one time. The method includes the following steps: a sample loading step: loading the sample to the sample loading chamber, and the sample entering the vacuum transport chamber through the vacuum transition chamber, wherein the sample is formed on a semiconductor substrate and includes a bottom electrode, an MTJ, a cap layer, and a mask layer; the MTJ includes a pinned layer, an isolation layer, and a free layer; and there are multiple isolation layers and free layers; a first etching step: the sample entering the IBE chamber or the reactive ion plasma etching chamber, etching the sample, and stopping etching at a particular isolation layer; and then the sample returning to the vacuum transport chamber; a first cleaning step: the sample entering the reactive ion plasma etching chamber or the IBE chamber, and removing metallic residues and treating a sample surface, so that metal contamination and a sidewall damage layer formed in the first etching step are completely removed; and then the sample returning to the vacuum transport chamber; a first dielectric coating step: the sample entering the film coating chamber, and forming a first dielectric thin film on the upper surface of and around the sample; and then the sample returning to the vacuum transport chamber; a first dielectric thin film opening step: the sample entering the reactive ion plasma etching chamber or the IBE chamber, opening the first dielectric thin film on the top and bottom portions of the device but leaving the part on a device sidewall, and stopping etching; and then the sample returning to the vacuum transport chamber; a second etching step: the sample entering the reactive ion plasma etching chamber or the IBE chamber, etching the remaining layers of the sample, and stopping etching at a bottom electrode metal layer; and then the sample returning to the vacuum transport chamber; a second cleaning step: the sample entering the IBE chamber or the reactive ion plasma etching chamber, and removing metallic residues and treating a sample surface, so that the metal contamination and sidewall damage layer formed in the second etching step are completely removed; and then the sample returning to the vacuum transport chamber; a second dielectric coating step: the sample entering the film coating chamber for coating protection, and forming a second dielectric thin film on the upper surface of and around the sample; and then, the sample returning to the vacuum transport chamber; and a sample take-out step: the sample returning from the vacuum transport chamber to the sample loading chamber through the vacuum transition chamber.

In the multilayer MTJ etching method of the present invention, preferably, an etching or cleaning angle in the IBE chamber ranges from 10° to 80°, which is an included angle between an ion beam and a normal face of a sample stage.

In the multilayer MTJ etching method of the present invention, the first dielectric thin film has a thickness of 0.5 nm to 5 nm, and the second dielectric thin film has a thickness of 1 nm to 500 nm.

In the multilayer MTJ etching method of the present invention, the MTJ sidewall with a thickness of 0.1 nm to 10.0 nm is removed separately in the first cleaning step and the second cleaning step.

An MRAM device is provided, which includes a multilayer MTJ prepared by using the multilayer MTJ etching method according to claim 6, where an isolation layer at which etching is stopped in the first etching step and a free layer above the isolation layer in the multilayer MTJ present a step-like structure.

In the present invention, the processing of the multilayer MTJ is always in a vacuum environment, thereby avoiding the impact of an external environment on etching. By means of the process of combining etching and cleaning, a device structure maintains good steepness, and the metal contamination and damage to an MTJ film structure are significantly decreased, thereby greatly improving the performance and reliability of a device. In addition, use of both the IBE chamber and the reactive ion plasma etching chamber solves the technical problem of an existing single etching method, and improves production efficiency and etching process precision.

DESCRIPTION OF THE EMBODIMENTS

To make the objective, technical solutions, and advantages of the present invention clearer, the technical solutions in the embodiments of the present invention are clearly and completely described below with reference to the accompanying drawings in the embodiments of the present invention. It should be noted that, the specific embodiments described herein are merely used for explaining the present invention, rather than limiting the present invention. The described embodiments are some rather than all of the embodiments of the present invention. Based on the described embodiments of the present invention, other embodiments acquired by those of ordinary skill in the art without creative effort all belong to the protection scope of the present invention.

In the description of the present invention, it should be noted that, the orientation or positional relationship indicated by the terms "upper", "lower", "vertical", "horizontal", etc. are based on the orientation or positional relationship shown in the accompanying drawings, and are only used for the convenience of describing the present invention and simplifying the description, rather than indicating or implying that the denoted device or element must have a specific orientation or be constructed and operated in a specific orientation. Therefore, these terms cannot be construed as limitations to the present invention. In addition, the terms "first" and "second" are merely used for description, but are not construed as indication or implying relative importance.

In addition, many specific details of the present invention, such as the structure, material, dimensions, and treatment process and technique of the device, are described below for a clearer understanding of the present invention. However, as those skilled in the art can understand, the present invention may not be implemented according to these specific details. Unless otherwise indicated below, various parts of the device may be made of materials known to those skilled in the art or materials with similar functions developed in the future.

Figure 1:
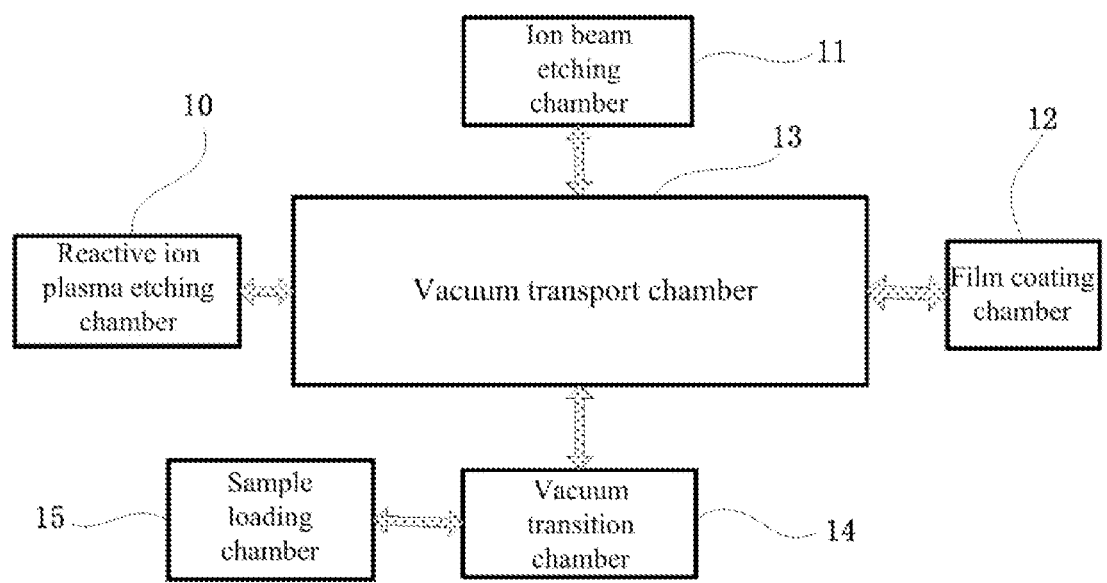
FIG. 1 is a functional block diagram of an etching device used in an MTJ etching method of the present invention.

A device used in an MTJ etching method of the present invention is described below with reference to the accompanying drawings. FIG. 1 is a functional block diagram of an etching device used in the MTJ etching method of the present invention. As shown in FIG. 1, the etching device includes a reactive ion plasma etching chamber 10, an IBE chamber 11, a film coating chamber 12, a vacuum transport chamber 13, a vacuum transition chamber 14, and a sample loading chamber 15. The vacuum transition chamber 14 is connected to the sample loading chamber 15 and the vacuum transport chamber 13 separately in a linkable manner. The reactive ion plasma etching chamber 10, the IBE chamber 11, and the film coating chamber 12 are separately connected to the vacuum transport chamber 13 in a linkable manner. In addition, there may be multiple chambers of each type.

The reactive ion plasma etching chamber 10 may be an inductively coupled plasma (ICP) chamber, a capacitively coupled plasma (CCP) chamber, a helicon wave plasma chamber, or the like. The IBE chamber 11 may be an ion beam etching chamber, a neutral particle beam etching chamber, or the like. The film coating chamber 12 may be a physical vapor deposition (PVD) coating chamber; and may also be a chemical vapor deposition (CVD) coating chamber, such as a pulsed CVD coating chamber, a plasma enhanced chemical vapor deposition (PECVD) coating chamber, an ICP-PECVD coating chamber, an atomic layer deposition (ALD) coating chamber, or the like.

In addition, the etching device further includes a sample transfer system for realizing sample delivery between the chambers, a control system for controlling the chambers and the sample transfer system, a vacuum pumping system for achieving a vacuum degree required by each chamber, a cooling system, and other functional units included in a conventional etching device. These device structures may all be implemented by those skilled in the art by using existing technology.

Figure 2:
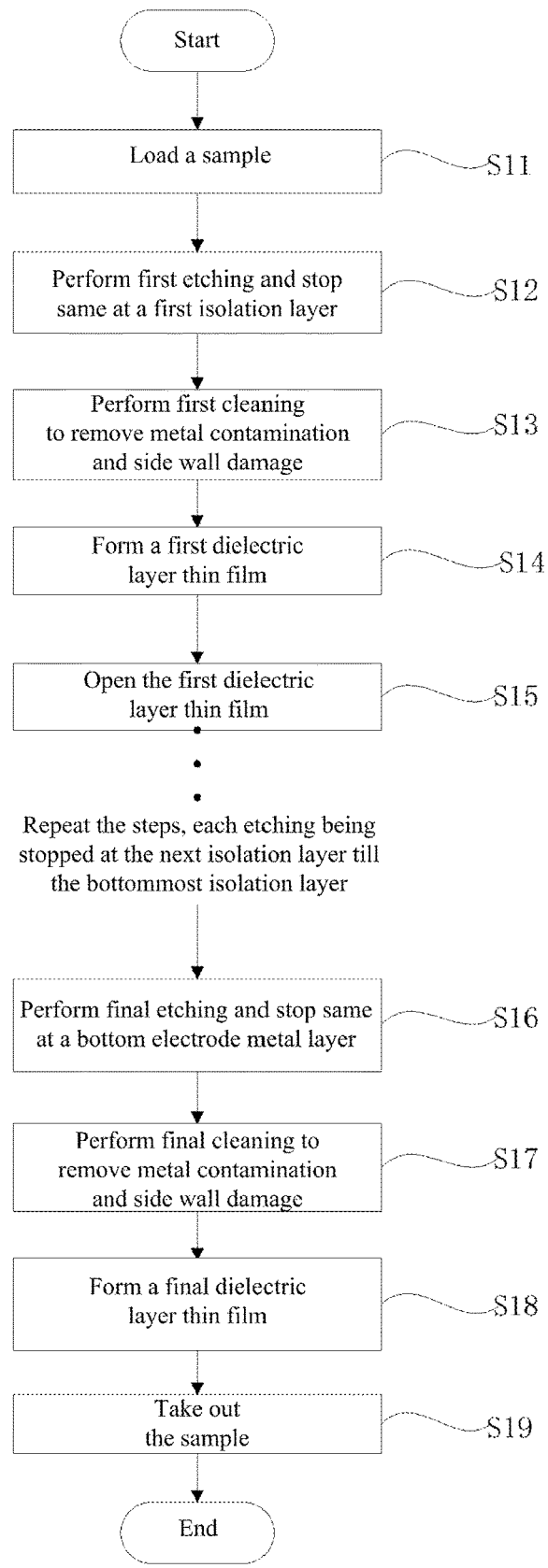
FIG. 2 is a flowchart of an embodiment of an MTJ etching method.

Before etching of a multilayer MTJ, a structure to be etched and containing a multilayer MTJ is formed on a semiconductor substrate. FIG. 2 is a schematic structural diagram of a device to be etched and containing a multilayer MTJ. As shown in FIG. 2, the structure to be etched includes a bottom electrode metal layer 100, an MTJ, a cap layer 104, and a hard mask layer 105, where the MTJ includes a pinned layer 101, an isolation layer 102, and a free layer 103. There are multiple isolation layers 102 and free layers 103 which are alternately formed on the pinned layer 101. The thickness and material of each layer and the number of the layers are selected according to actual requirements. For ease of description, the isolation layers 102 are described below as a first isolation layer, a second isolation layer, and a third isolation layer from top to bottom.

Figure 3:
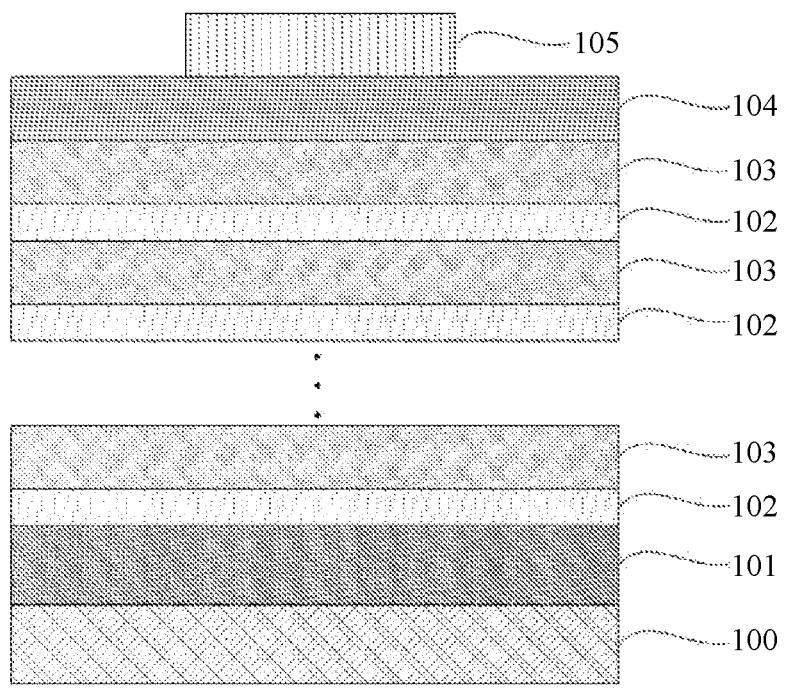
FIG. 3 is a schematic structural diagram of a sample containing a multilayer MTJ.

FIG. 3 is a flowchart of an embodiment of a multilayer MTJ etching method. As shown in FIG. 3, in a sample loading step S11, a sample is loaded to the sample loading chamber 15 and enters the vacuum transport chamber 13 through the vacuum transition chamber 14.

Afterwards, in a first etching step S12, the sample enters the reactive ion plasma etching chamber 10, and is etched by using reactive ion plasma. Etching is stopped at the first isolation layer. Then, the sample returns to the vacuum transport chamber 13. Gas used in the reactive ion plasma etching chamber may be inert gas, nitrogen, oxygen, fluorine-based gas, $NH_3$, amino gas, CO, $CO_2$, alcohol, or the like. It is required to realize device separation and achieve steepness required by the device during etching.

Figure 4:
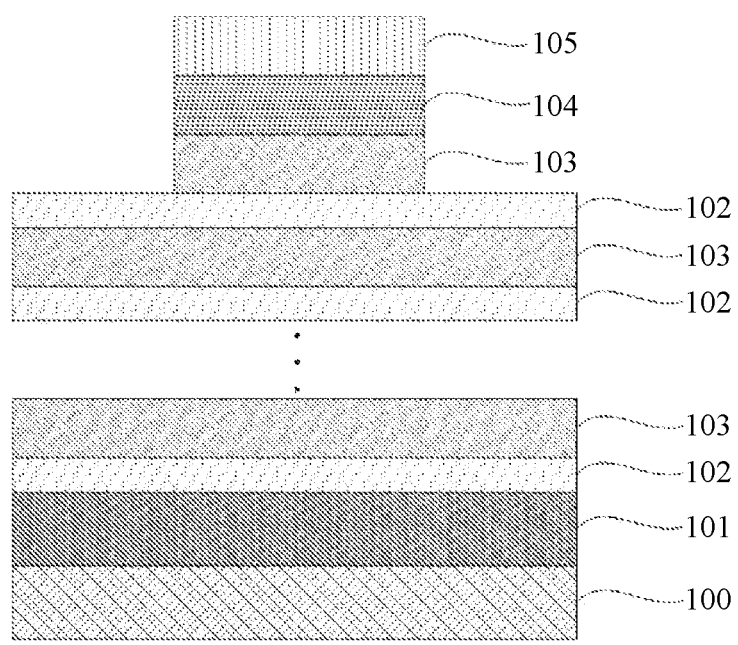
FIG. 4 is a schematic structural diagram of a device formed after etching to a first isolation layer and cleaning.

Minimal metal contamination such as contamination less than 1 nm may be produced and a Nano-scale damage layer may also be formed on the MTJ sidewall during etching. Therefore, subsequently, in a first cleaning step S13, the sample enters the IBE chamber 11, and metallic residues are removed and the sample surface is treated by using ion beams. Then the sample returns to the vacuum transport chamber 13. Gas used in the IBE chamber may be inert gas, nitrogen, oxygen, or the like. An IBE angle preferably ranges from 10° to 80°, which is an included angle between the ion beam and a normal face of a wafer. Preferably, 0.1 nm to 10.0 nm MTJ sidewall is removed, so that the metal contamination and the sidewall damage layer formed in the first etching step are completely removed. FIG. 4 is a schematic structural diagram of a device formed after the first cleaning step.

Figure 5:
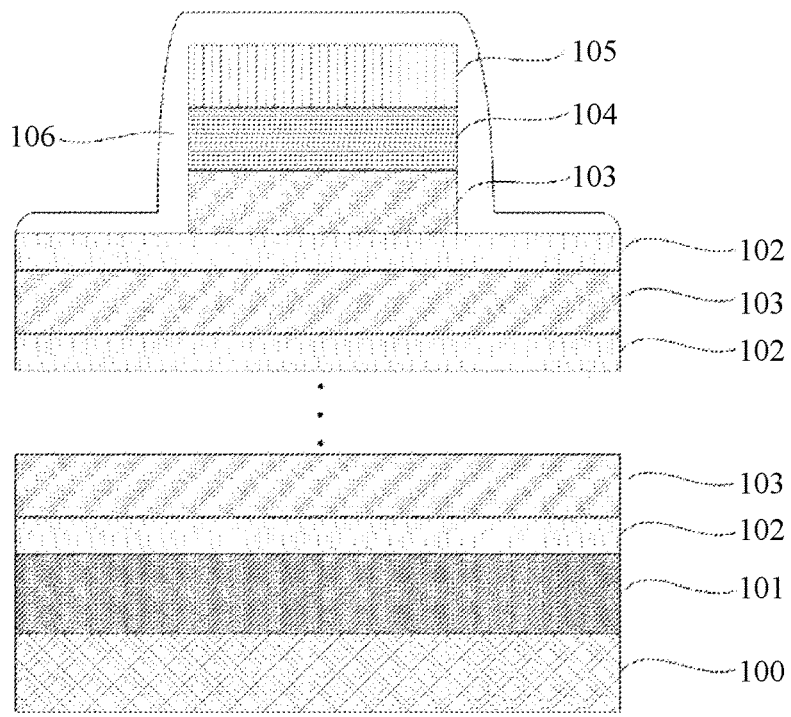
FIG. 5 is a schematic structural diagram of a device formed after a first dielectric coating step.

Afterwards, in a first dielectric coating step S14, the sample enters the film coating chamber 12 and a first dielectric thin film 106 is formed on the upper surface of and around the sample which has been subjected to the foregoing etching process; and then the sample returns to the vacuum transport chamber 13. FIG. 5 is a schematic structural diagram of a device formed after the first dielectric coating step. The first dielectric thin film 106 formed by coating is a dielectric material capable of realizing separation of adjacent MTJ devices, which may be, for example, a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or the like. The first dielectric thin film may have a thickness of above 0.5 nm but below 50 nm. By the first dielectric coating step, the sidewall of the opened MTJ can be prevented from damage by plasma in the subsequent etching process.

Then in a first dielectric thin film opening step S15, the sample which has been subjected to film coating in the foregoing step enters the reactive ion plasma etching chamber 10, and the first dielectric thin film 106 is etched by using reactive ion plasma, so that the first dielectric thin film 106 on the top and bottom portions of the device is etched away. Because the thickness of the first dielectric thin film formed on the MTJ sidewall is greater than that of the first dielectric thin film formed on the horizontal surface, part of the first dielectric thin film 106 still remains on the MTJ sidewall.

Figure 6:
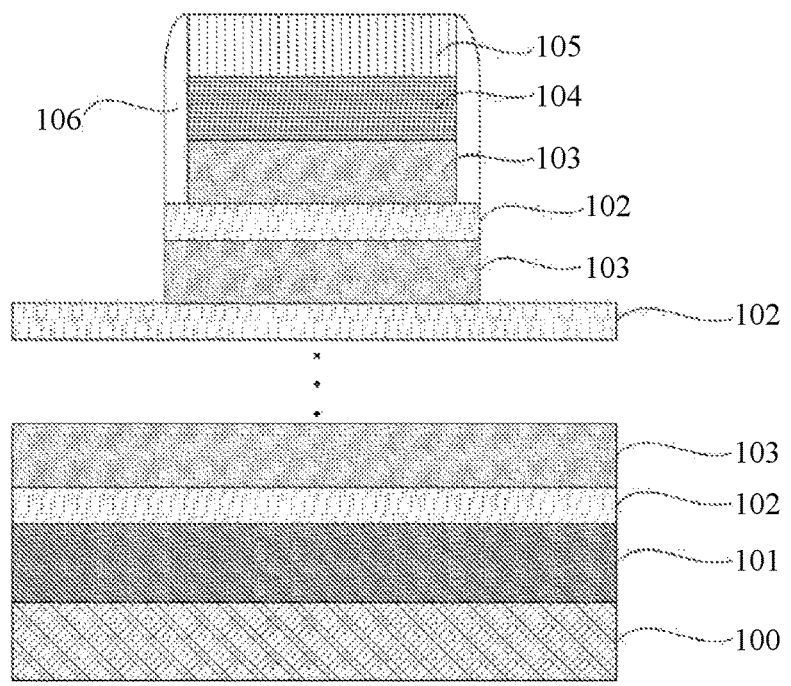
FIG. 6 is a schematic structural diagram of a device formed after etching to a second isolation layer and cleaning.
Figure 7:
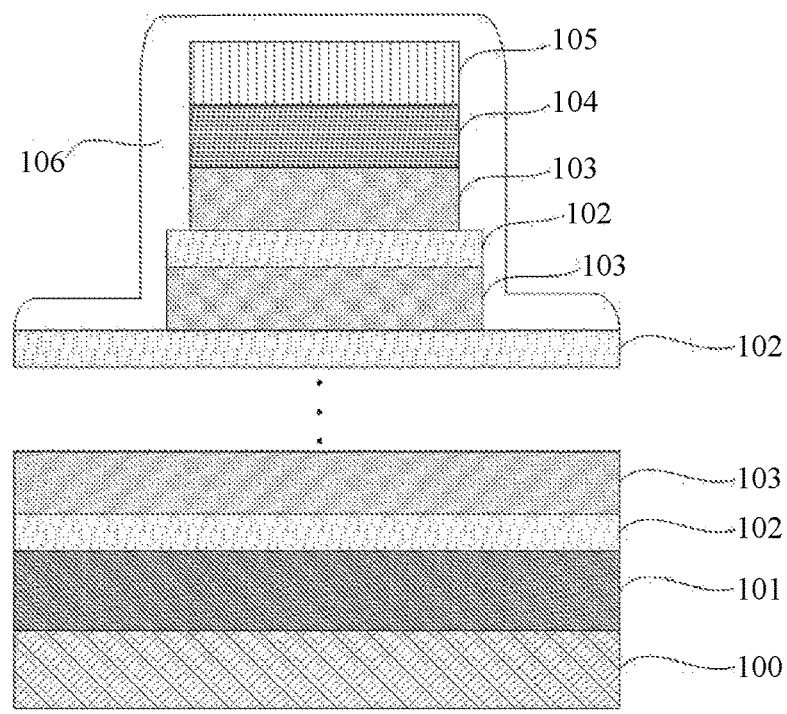
FIG. 7 is a schematic structural diagram of a device formed after repetition of the first dielectric coating step.
Figure 8:
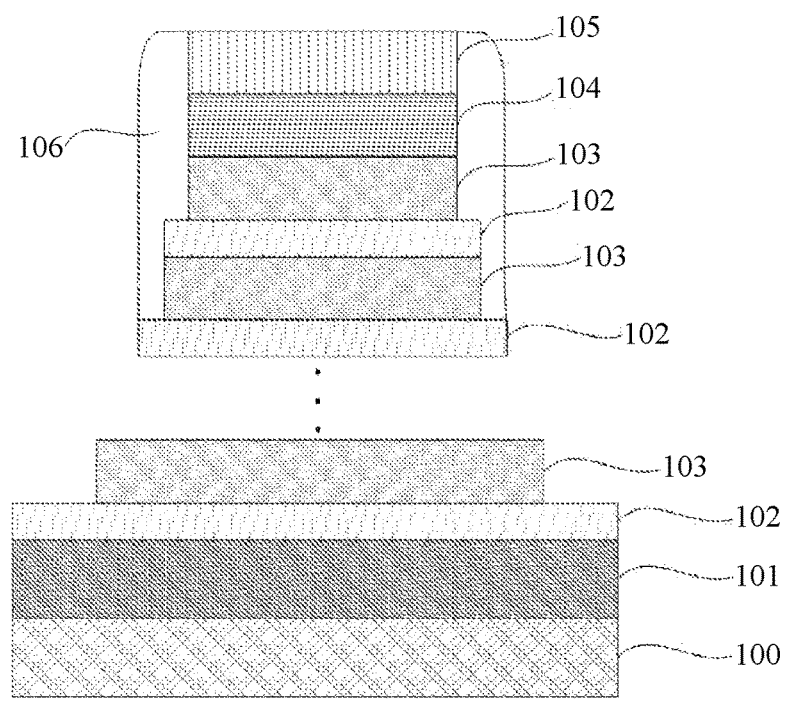
FIG. 8 is a schematic structural diagram of a device formed after etching to a bottommost isolation layer and cleaning.

The sample continuously stays in the reactive ion plasma etching chamber 10, the first etching step S12 is repeated to etch the sample by using reactive ion plasma, and etching is stopped at the second isolation layer. Then, the first cleaning step S13 is repeated to remove metal contamination and sidewall damage, to obtain a structure shown in FIG. 6. The first dielectric coating step S14 is repeated to form a first dielectric thin film on the structure which has been subjected to the foregoing second etching and cleaning, to obtain a structure shown in FIG. 7. Then, the first dielectric thin film opening step S15 is continuously performed. By leaving part of the dielectric thin film on the sidewall of the etched MTJ, the sidewall of the opened MTJ can be prevented from damage by plasma in the subsequent etching process. Afterwards, steps S12 to S15 are repeated and etching is performed until the bottommost isolation layer, as shown in FIG. 8.

Subsequently, a final etching step S16 is performed. The MTJ is continuously etched in the reactive ion plasma etching chamber 10, and etching is stopped at the bottom electrode metal layer 100. The used gas may be inert gas, nitrogen, oxygen, fluorine-based gas, $NH_3$, amino gas, CO, $CO_2$, alcohol, or the like. Because the opened MTJ is protected by the first dielectric thin film 106, it is not required to consider the damage to the film layers of the protected MTJ in subsequent etching and thus the used etching gas can be selected from a wider range.

Figure 9:
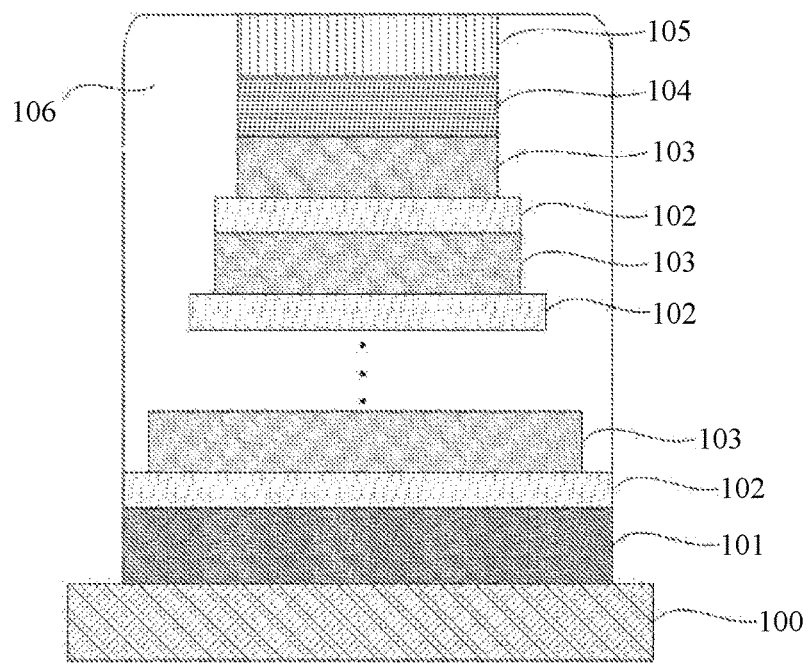
FIG. 9 is a schematic structural diagram of a device formed after etching to a bottom electrode metal layer and cleaning.

Then in a final cleaning step S17, the sample enters the IBE chamber 11, and metallic residues are removed and the sample surface is treated by using ion beams, so that the metal contamination and the sidewall damage layer formed in the foregoing etching step are completely removed. Then, the sample returns to the vacuum transport chamber 13. Gas used in the IBE chamber may be inert gas, nitrogen, oxygen, or the like. An IBE angle preferably ranges from 10° to 80°, and preferably, 0.1 nm to 10.0 nm MTJ sidewall is removed. After the foregoing etching and cleaning steps, the device sidewall is clean and complete separation is realized. FIG. 9 is a schematic structural diagram of a device formed after the final cleaning step.

Figure 10:
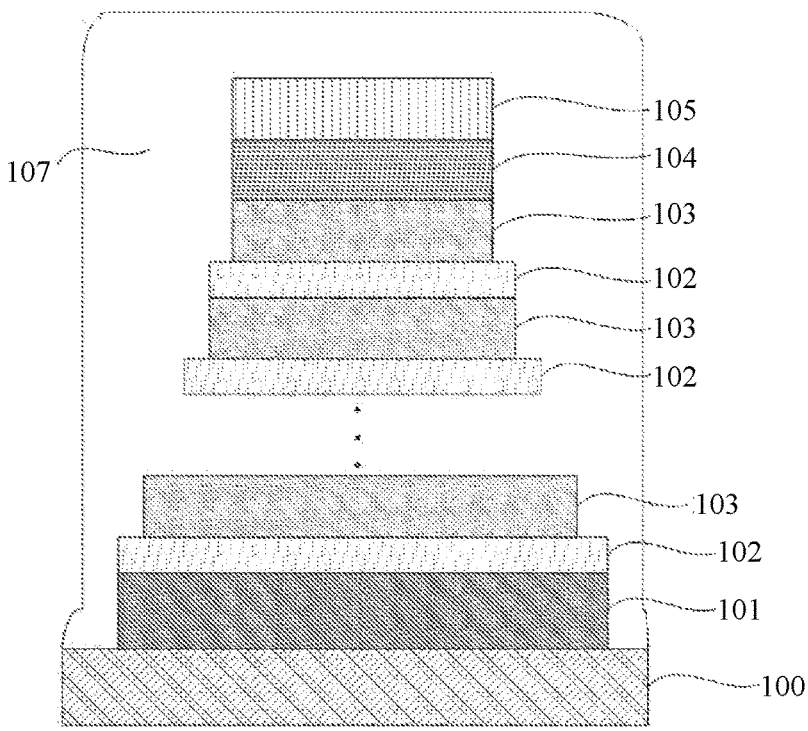
FIG. 10 is a schematic structural diagram of a device formed after a final dielectric coating step.

Afterwards, in a final dielectric coating step S18, the sample enters the film coating chamber 12 for coating protection, and a final dielectric thin film 107 is formed on the upper surface of and around the sample. Then, the sample returns to the vacuum transport chamber 13. The material of the final dielectric thin film may be a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or other dielectric materials capable of realizing separation of adjacent MTJ devices. The final dielectric thin film may have a thickness of above 1 nm but below 500 nm. The final dielectric coating step can prevent the device from damage when exposed to the atmosphere in the subsequent process, and further can realize complete insulation and isolation between devices. FIG. 10 is a schematic structural diagram of a device formed after the final dielectric coating step.

Finally, in a sample take-out step S19, the sample returns from the vacuum transport chamber 13 to the sample loading chamber 15 through the vacuum transition chamber 14.

The above merely describes one specific embodiment of the multilayer MTJ etching method of the present invention, but the present invention is not limited thereto. In other embodiments of the multilayer MTJ etching method of the present invention, the first etching step, the final etching step, and the first dielectric thin film opening step may also be performed in the IBE chamber by using ion beams to complete etching. The first and final cleaning steps may also be performed in the reactive ion plasma etching chamber by using reactive ion plasma to complete cleaning. That is to say, each etching step and each cleaning step may be performed in the reactive ion plasma etching chamber or the IBE chamber by selection, thus realizing multiple possible technological processes. These technological processes all fall within the protection scope of the present invention. However, considering from the production efficiency and the precision of the etching process, the present invention does not adopt a solution in which all the etching and cleaning steps are performed in the same chamber (the IBE chamber or the reactive ion plasma etching chamber). In other words, the reactive ion plasma etching chamber and the IBE chamber must be separately used at least one time in the MTJ etching method of the present invention. In addition, specific implementations of the steps may vary from each other according to different conditions. In the etching or cleaning steps in the IBE chamber, the gas, ion beam angles, ion beam energy, and ion beam density that are used in different steps may be identical or different. In the etching or cleaning steps in the reactive ion plasma etching chamber, the gas, power, airflows, and pressure that are used in different steps may be identical or different.

In this embodiment, the processing of the MTJ is always in a vacuum environment, thereby avoiding the impact of an external environment on etching. Further, the isolation layers and the free layers are all subjected to etching, cleaning, and coating protection in different steps, thus significantly alleviating the metal contamination and damage to the MTJ film structure and greatly improving device performance and reliability. In addition, use of both the IBE chamber and the reactive ion plasma etching chamber solves the problems caused by a single etching method in the prior art, and improves production efficiency and etching process precision.

Moreover, in an MTJ formed according to the foregoing embodiment of the multilayer MTJ etching method, as shown in FIG. 10, each isolation layer 102 and the free layer 103 above the isolation layer present a step-like structure. Accordingly, an MRAM device containing the multilayer MTJ also has such a feature.

Figure 11:
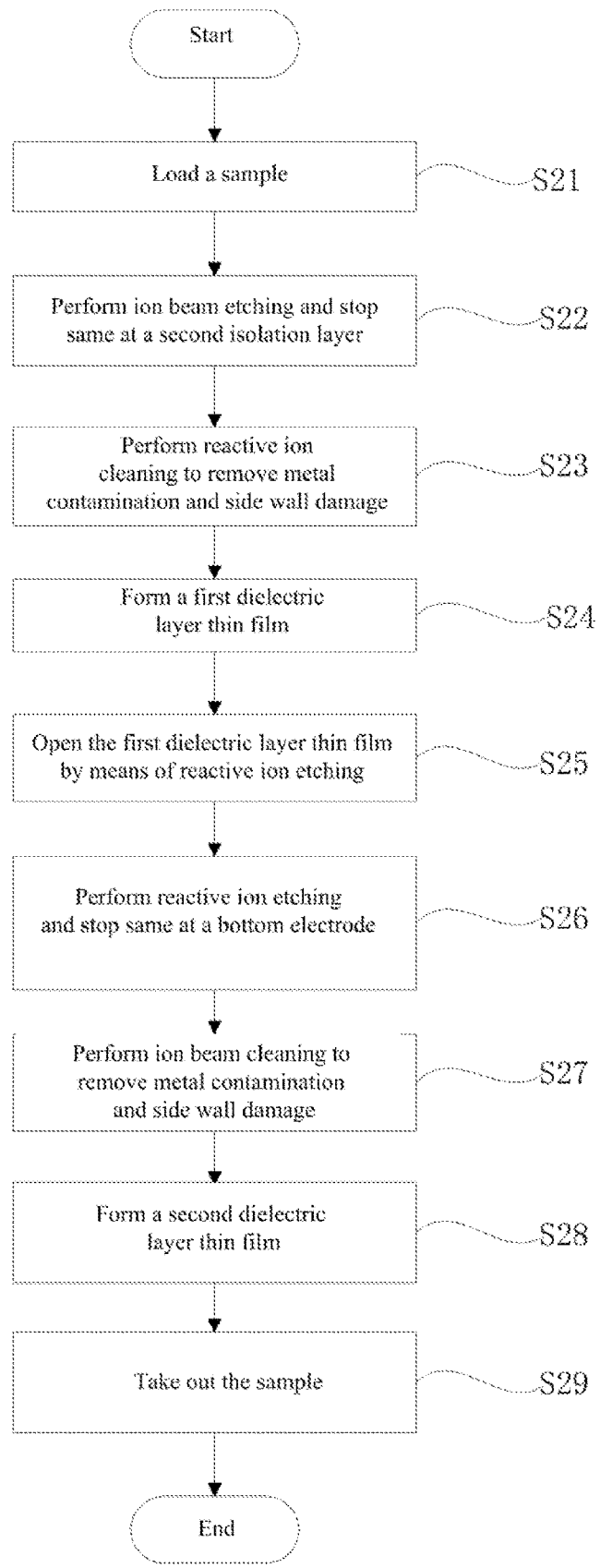
FIG. 11 is a flowchart of another embodiment of an MTJ etching method.

FIG. 11 is a flowchart of another embodiment of a multilayer MTJ etching method. Subsequently, in a sample loading step S21, a sample is loaded to a sample loading chamber 15, and enters a vacuum transport chamber 13 through a vacuum transition chamber 14.

In a first etching step S22, the sample enters an IBE chamber 11 and is etched by using ion beams. Etching is stopped at a second isolation layer, and then the sample returns to the vacuum transport chamber 13. Gas used in the IBE chamber may be inert gas, nitrogen, oxygen, or the like; and an IBE angle preferably ranges from 10° to 80°.

Figure 12:
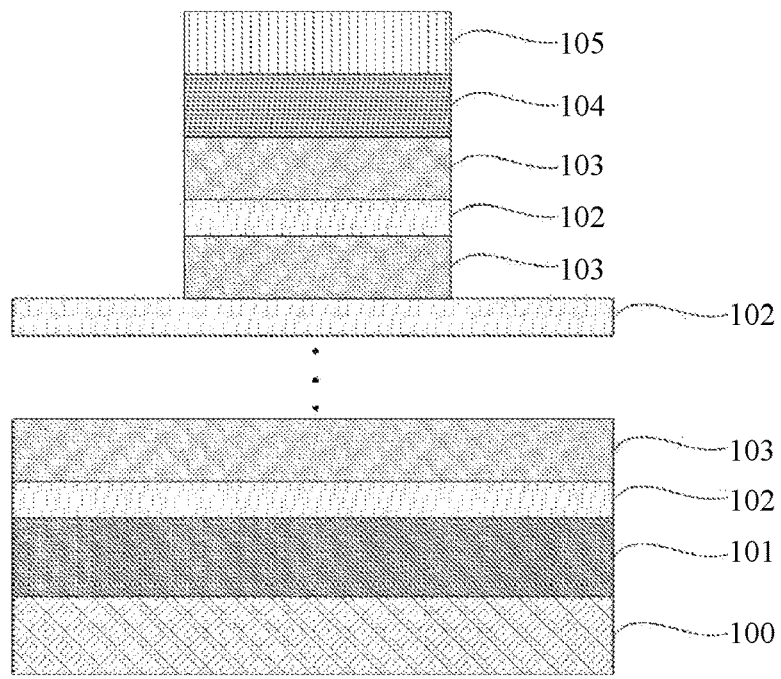
FIG. 12 is a schematic structural diagram of a device formed after a first cleaning step.

Then in a first cleaning step S23, the sample enters a reactive ion plasma etching chamber 10, and is cleaned by using reactive ion plasma, to remove metal contamination and sidewall damage. An obtained structure is shown in FIG. 12. Afterwards, the sample returns to the vacuum transport chamber 13. Preferably, an MTJ sidewall with a thickness of 0.1 nm to 10.0 nm is removed, so that the metal contamination and the sidewall damage are completely removed. Gas used in the reactive ion plasma etching chamber may be inert gas, nitrogen, oxygen, fluorine-based gas, $NH_3$, amino gas, CO, $CO_2$, alcohol, or the like.

Figure 13:
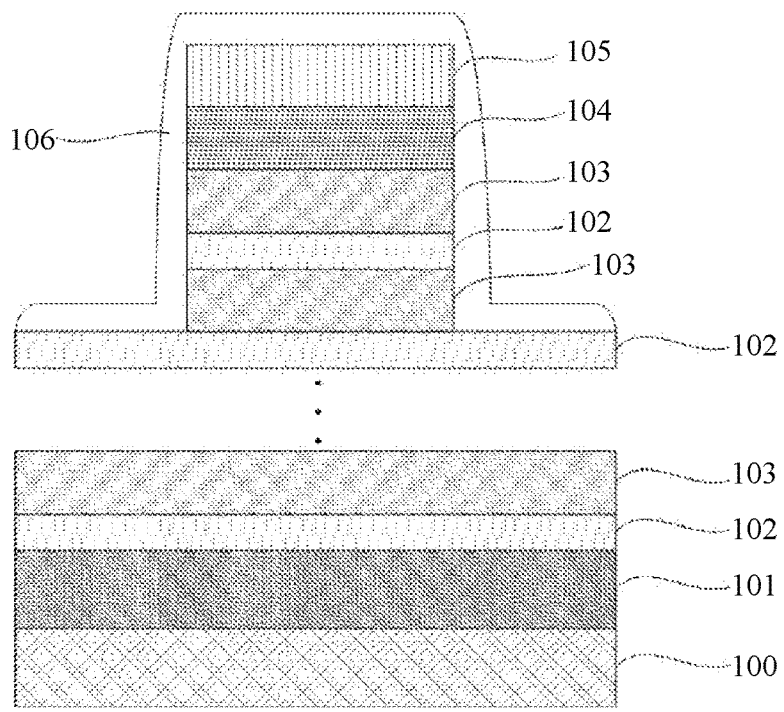
FIG. 13 is a schematic structural diagram of a device formed after a first dielectric coating step.

Afterwards, in a first dielectric coating step S24, the sample enters a film coating chamber 12 and a first dielectric thin film 106 is formed on the upper surface of and around the sample which has been subjected to the foregoing etching process; and then the sample returns to the vacuum transport chamber 13. FIG. 13 is a schematic structural diagram of a device formed after the first dielectric coating step. The first dielectric thin film 106 formed by coating is a dielectric material capable of realizing separation of adjacent MTJ devices, which may be, for example, a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or the like. The first dielectric thin film may have a thickness of above 0.5 nm but below 50 nm. By the first dielectric coating step, the sidewall of the opened MTJ can be prevented from damage by plasma in the subsequent etching process.

Figure 14:
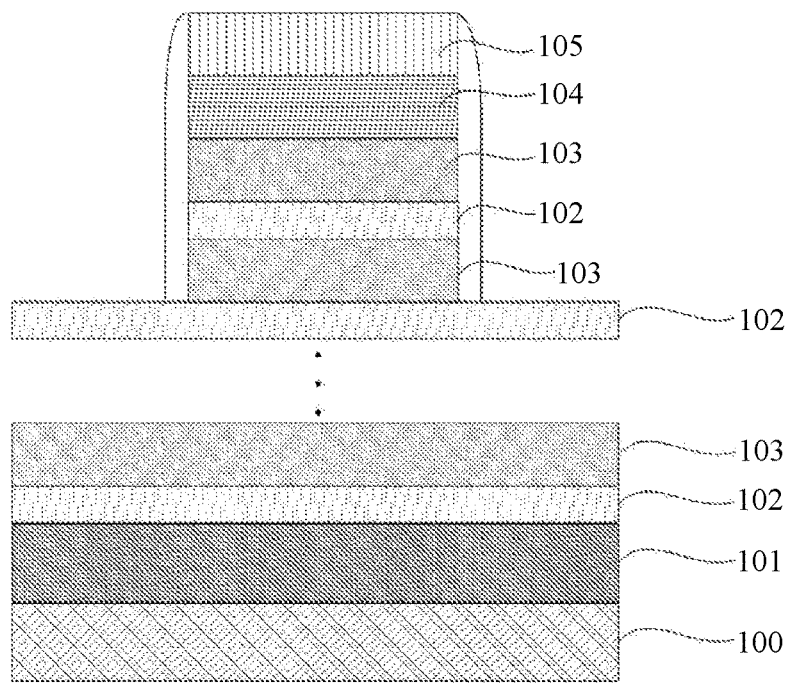
FIG. 14 is a schematic structural diagram of a device formed after a first dielectric thin film opening step.

Then in a first dielectric thin film opening step S25, the sample which has been subjected to film coating in the foregoing step enters the reactive ion plasma etching chamber 10, and the first dielectric thin film is etched by using reactive ion plasma, so that the first dielectric thin film on the top and bottom portions of the device is etched away. Because the thickness of the first dielectric thin film formed on the MTJ sidewall is greater than that of the first dielectric thin film formed on the horizontal surface, part of the first dielectric thin film 106 still remains on the MTJ sidewall. An etching endpoint of the first dielectric thin film is defined by using an automatic optical endpoint detector in the reactive ion etching chamber. FIG. 14 is a schematic structural diagram of a device formed after the first dielectric thin film opening step.

Subsequently, in a second etching step S26, the multilayer MTJ is continuously etched in the reactive ion plasma etching chamber 10, and etching is stopped at a bottom electrode metal layer 100. The used gas may be inert gas, nitrogen, oxygen, fluorine-based gas, $NH_3$, amino gas, CO, $CO_2$, alcohol, or the like. The gas used in this step may be identical with or different from that used in the first etching step. Because the opened MTJ is protected by the first dielectric thin film 108, it is not required to consider the damage to the film layers of the protected MTJ in subsequent etching and thus the used etching gas can be selected from a wider range.

Figure 15:
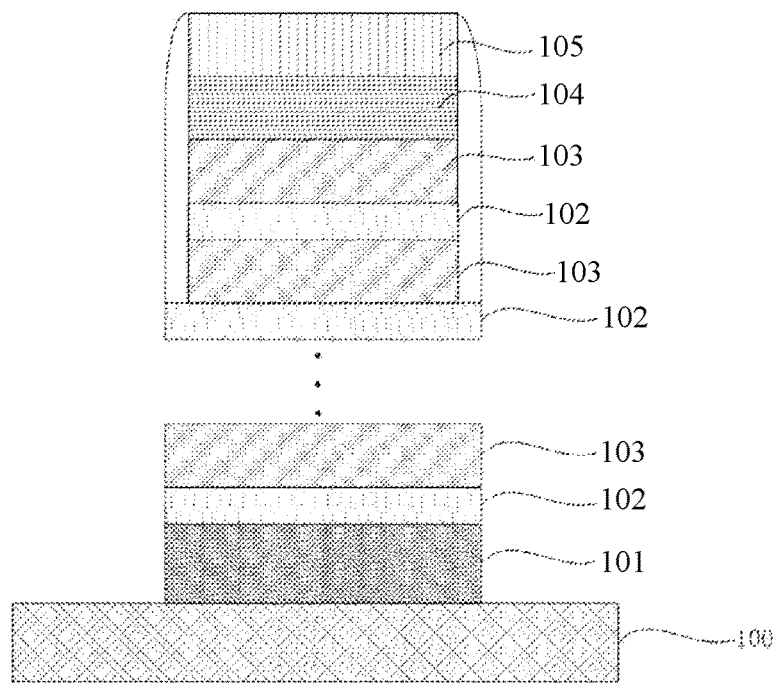
FIG. 15 is a schematic structural diagram of a device formed after a second cleaning step.

Then in a second cleaning step S27, the sample enters the IBE chamber 11, and metallic residues are removed and the sample surface is treated by using ion beams, so that the metal contamination and the sidewall damage layer formed in the foregoing etching step are completely removed. Then, the sample returns to the vacuum transport chamber 13. Gas used in the IBE chamber may be inert gas, nitrogen, oxygen, or the like. An IBE angle preferably ranges from 10° to 80°, and preferably, 0.1 nm to 10.0 nm MTJ sidewall is removed. After the foregoing etching and cleaning steps, the device sidewall is clean and complete separation is realized. FIG. 15 is a schematic structural diagram of a device formed after the second cleaning step.

Figure 16:
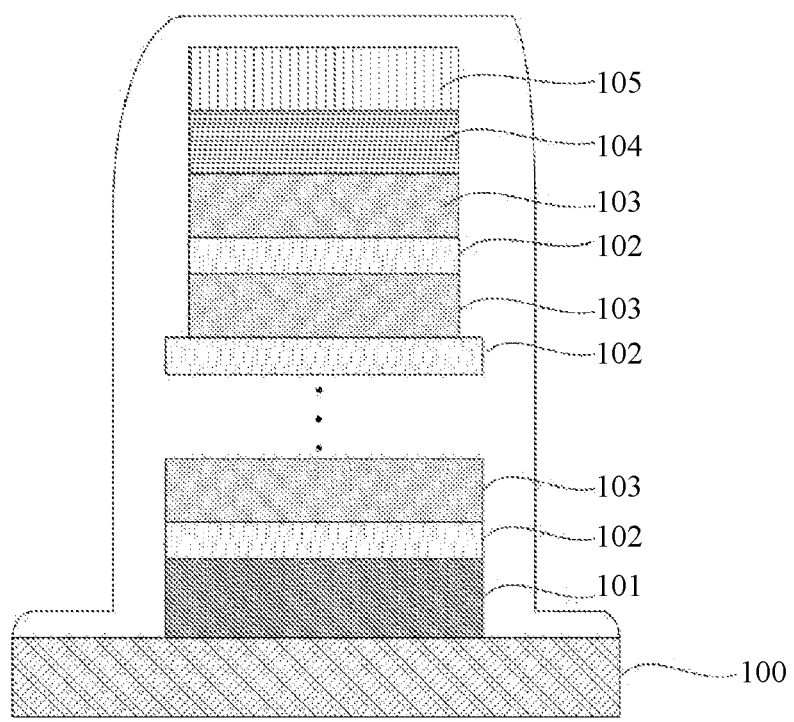
FIG. 16 is a schematic structural diagram of a device formed after a second dielectric coating step.

Afterwards, in a second dielectric coating step S28, the sample enters the film coating chamber 12 for coating protection, and a second dielectric thin film 107 is formed on the upper surface of and around the sample. Then, the sample returns to the vacuum transport chamber 13. The material of the second dielectric thin film may be a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or other dielectric materials capable of realizing separation of adjacent MTJ devices. The second dielectric thin film may have a thickness of above 1 nm but below 500 nm. The second dielectric coating step can prevent the device from damage when exposed to the atmosphere in the subsequent process, and further can realize complete insulation and isolation between devices. FIG. 16 is a schematic structural diagram of a device formed after the second dielectric coating step.

Finally, in a sample take-out step S29, the sample returns from the vacuum transport chamber 13 to the sample loading chamber 15 through the vacuum transition chamber 14.

The above merely describes one specific embodiment of the multilayer MTJ etching method of the present invention, but the present invention is not limited thereto. In other embodiments of the multilayer MTJ etching method of the present invention, the first etching step may also be stopped at any other isolation layer, such as the first isolation layer, the third isolation layer, the fourth isolation layer, or the like. In addition, the first etching step may also be performed in the reactive ion plasma etching chamber, and the second etching step may also be performed in the IBE chamber. That is to say, each etching step and each cleaning step may be performed in the reactive ion plasma etching chamber or the IBE chamber by selection, thus realizing multiple possible technological processes. These technological processes all fall within the protection scope of the present invention. However, considering from the production efficiency and the precision of the etching process, the present invention does not adopt a solution in which all the etching and cleaning steps are performed in the same chamber (the IBE chamber or the reactive ion plasma etching chamber). In other words, the reactive ion plasma etching chamber and the IBE chamber must be separately used at least one time in the multilayer MTJ etching method of the present invention. In addition, specific implementations of the steps may vary from each other according to different conditions. In the etching or cleaning steps in the IBE chamber, the gas, ion beam angles, ion beam energy, and ion beam density that are used in different steps may be identical or different. In the etching or cleaning steps in the reactive ion plasma etching chamber, the gas, power, airflows, and pressure that are used in different steps may be identical or different.

In this embodiment, the processing of the multilayer MTJ is always in a vacuum environment, thereby avoiding the impact of an external environment on etching. By means of the process of combining etching and cleaning, a device structure maintains good steepness, and the metal contamination and damage to an MTJ film structure are significantly decreased, thereby greatly improving the performance and reliability of a device. In addition, use of both the IBE chamber and the reactive ion plasma etching chamber solves the technical problem of an existing single etching method, and improves production efficiency and etching process precision.

Moreover, in an MTJ formed according to the foregoing embodiment of the multilayer MTJ etching method, as shown in FIG. 16, the second isolation layer 102 and the free layer 103 above the second isolation layer present a step-like structure. Accordingly, an MRAM device containing the multilayer MTJ also has such a feature. Definitely, the present invention is not limited thereto. When the first etching step is stopped at another isolation layer, for example, the third isolation layer or the fourth isolation layer, this isolation layer and the free layer above it together present a step-like structure.

The above merely describes a preferred embodiment of the present invention, but the protection scope of the present invention is not limited thereto. Changes or replacements easily conceived by any person skilled in the art within the technical scope of the present invention all fall within the protection scope of the present invention.

What is claimed is:

1. A multilayer magnetic tunnel junction (MTJ) etching method, using an etching device comprising a sample loading chamber, a vacuum transition chamber, a reactive ion plasma etching chamber, an ion beam etching (IBE) chamber, a film coating chamber, and a vacuum transport chamber, wherein the vacuum transition chamber is connected to the sample loading chamber and the vacuum transport chamber separately in a linkable manner; the reactive ion plasma etching chamber, the IBE chamber, and the film coating chamber are separately connected to the vacuum transport chamber in a linkable manner; a sample is processed without interrupting the vacuum, and the reactive ion plasma etching chamber and the IBE chamber are separately used at least one time; and the method comprises the following steps:

a sample preparation step and a sample loading step: loading the sample to the sample loading chamber, and the sample entering the vacuum transport chamber through the vacuum transition chamber, wherein the sample is formed on a semiconductor substrate and comprises a bottom electrode, an MTJ, a cap layer, and a mask layer; the MTJ comprises a pinned layer, an isolation layer, and a free layer; and there are multiple isolation layers and free layers;

a first etching step: the sample entering the reactive ion plasma etching chamber or the IBE chamber, completing etching for the cap layer and the free layer and stopping etching at a first isolation layer, and then the sample returning to the vacuum transport chamber;

a first cleaning step: the sample entering the IBE chamber or the reactive ion plasma etching chamber, and removing metallic residues and treating a sample surface, so that metal contamination and a sidewall damage layer formed in the first etching step are completely removed; and then the sample returning to the vacuum transport chamber;

a first dielectric coating step: the sample entering the film coating chamber, and forming a first dielectric thin film on the upper surface of and around the sample; and then the sample returning to the vacuum transport chamber;

a first dielectric thin film opening step: the sample entering the reactive ion plasma etching chamber or the IBE chamber, opening the first dielectric thin film on the top and bottom portions of the device but leaving the part on a device sidewall, and stopping etching; and then the sample returning to the vacuum transport chamber;

repeating the foregoing steps, wherein each etching is stopped at the next isolation layer till a bottommost isolation layer;

a final etching step: the sample entering the reactive ion plasma etching chamber or the IBE chamber, etching the sample, and stopping etching at a bottom electrode metal layer; and then the sample returning to the vacuum transport chamber;

a final cleaning step: the sample entering the IBE chamber or the reactive ion plasma etching chamber, and removing metallic residues and treating a sample surface, so that the metal contamination and sidewall damage layer formed in the final etching step are completely removed; and then the sample returning to the vacuum transport chamber;

a final dielectric coating step: the sample entering the film coating chamber for coating protection, and forming a final dielectric thin film on the upper surface of and around the sample; and then, the sample returning to the vacuum transport chamber; and a sample take-out step: the sample returning from the vacuum transport chamber to the sample loading chamber through the vacuum transition chamber.

2. The multilayer MTJ etching method according to claim 1, wherein gas used in the etching or cleaning step in the reactive ion plasma etching chamber is inert gas, nitrogen, oxygen, fluorine-based gas, $NH_3$, amino gas, CO, $CO_2$, alcohol, or a combination thereof; and the gas, power, airflows, and pressure that are used in different steps are identical or different.

3. The multilayer MTJ etching method according to claim 1, wherein gas used in the etching or cleaning step in the IBE chamber is inert gas, nitrogen, oxygen, or a combination thereof; and the gas, ion beam angles, ion beam energy, and ion beam density that are used in different steps are identical or different.

4. The multilayer MTJ etching method according to claim 1, wherein materials of the first dielectric thin film and the final dielectric thin film are identical or different; the material of the first dielectric thin film or the final dielectric thin film is a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or a combination thereof; and the materials of the first dielectric thin film are identical or different in different first dielectric coating steps.

5. A magnetic random access memory (MRAM) device, comprising a multilayer magnetic tunnel junction (MTJ) prepared by using the multilayer MTJ etching method according to claim 1, wherein each isolation layer and a free layer above the isolation layer in the multilayer MTJ present a step-like structure.

6. A multilayer magnetic tunnel junction (MTJ) etching method, using an etching device comprising a sample loading chamber, a vacuum transition chamber, a reactive ion plasma etching chamber, an ion beam etching (IBE) chamber, a film coating chamber, and a vacuum transport chamber, wherein the vacuum transition chamber is connected to the sample loading chamber and the vacuum transport chamber separately in a linkable manner; the reactive ion plasma etching chamber, the IBE chamber, and the film coating chamber are separately connected to the vacuum transport chamber in a linkable manner; a sample is processed without interrupting the vacuum, and the reactive ion plasma etching chamber and the IBE chamber are separately used at least one time; and the method comprises the following steps:

a sample loading step: loading the sample to the sample loading chamber, and the sample entering the vacuum transport chamber through the vacuum transition chamber, wherein the sample is formed on a semiconductor substrate and comprises a bottom electrode, an MTJ, a cap layer, and a mask layer; the MTJ comprises a pinned layer, an isolation layer, and a free layer; and there are multiple isolation layers and free layers;

a first etching step: the sample entering the IBE chamber or the reactive ion plasma etching chamber, etching the sample, and stopping etching at a particular isolation layer; and then the sample returning to the vacuum transport chamber;

a first cleaning step: the sample entering the reactive ion plasma etching chamber or the IBE chamber, and removing metallic residues and treating a sample surface, so that metal contamination and a sidewall damage layer formed in the first etching step are completely removed; and then the sample returning to the vacuum transport chamber;

a first dielectric coating step: the sample entering the film coating chamber, and forming a first dielectric thin film on the upper surface of and around the sample; and then the sample returning to the vacuum transport chamber;

a first dielectric thin film opening step: the sample entering the reactive ion plasma etching chamber or the IBE chamber, opening the first dielectric thin film on the top and bottom portions of the device but leaving the part on a device sidewall, and stopping etching; and then the sample returning to the vacuum transport chamber;

a second etching step: the sample entering the reactive ion plasma etching chamber or the IBE chamber, etching the remaining layers of the sample, and stopping etching at a bottom electrode metal layer; and then the sample returning to the vacuum transport chamber;

a second cleaning step: the sample entering the IBE chamber or the reactive ion plasma etching chamber, and removing metallic residues and treating a sample surface, so that the metal contamination and sidewall damage layer formed in the second etching step are completely removed; and then the sample returning to the vacuum transport chamber;

a second dielectric coating step: the sample entering the film coating chamber for coating protection, and forming a second dielectric thin film on the upper surface of and around the sample; and then, the sample returning to the vacuum transport chamber; and a sample take-out step: the sample returning from the vacuum transport chamber to the sample loading chamber through the vacuum transition chamber.

7. The multilayer MTJ etching method according to claim 6, wherein an etching or cleaning angle in the IBE chamber ranges from 10° to 80°, which is an included angle between an ion beam and a normal face of a sample stage.

8. The multilayer MTJ etching method according to claim 6, wherein the first dielectric thin film has a thickness of 0.5 nm to 5 nm, and the second dielectric thin film has a thickness of 1 nm to 500 nm.

9. The multilayer MTJ etching method according to claim 6, wherein the MTJ sidewall with a thickness of 0.1 nm to 10.0 nm is removed separately in the first cleaning step and the second cleaning step.

10. A magnetic random access memory (MRAM) device, comprising a multilayer magnetic tunnel junction (MTJ) prepared by using the multilayer MTJ etching method according to claim 6, wherein the isolation layer at which etching is stopped in the first etching step and the free layer above the isolation layer in the multilayer MTJ present a step-like structure.

* * * * *